United States Patent [19]

Aisu

[11] Patent Number: 5,227,793
[45] Date of Patent: Jul. 13, 1993

[54] CURRENT MODE DIGITAL-TO-ANALOG CONVERTER USING COMPLEMENTARY DEVICES

[75] Inventor: Katsuhiko Aisu, Minoo, Japan
[73] Assignee: Ricoh Company, Ltd., Tokyo, Japan
[21] Appl. No.: 839,197
[22] Filed: Feb. 20, 1992
[30] Foreign Application Priority Data
  Feb. 22, 1991 [JP] Japan .................. 3-050498
[51] Int. Cl.⁵ .................................. H03M 1/66
[52] U.S. Cl. ........................... 341/136; 341/144
[58] Field of Search ............... 341/136, 144, 145, 150, 341/148, 153, 154

[56] References Cited
U.S. PATENT DOCUMENTS
  4,683,458  7/1987  Hallgren ............... 341/144
  5,055,844 10/1991  Kasai .................. 341/144

*Primary Examiner*—A. D. Pellinen
*Assistant Examiner*—Brian K. Young
*Attorney, Agent, or Firm*—Cooper & Dunham

[57] ABSTRACT

A digital-to-analog converter employing CMOS configuration. A first load resistor is selectively connected between an output terminal and ground. A first output circuit, selectively connected between the output terminal and a positive supply voltage, comprises a plurality of PMOS transistors constituting constant-current sources and electronic switches connected in series. A second load resistor is selectively connected between the output terminal and the positive supply voltage. A second output circuit, selectively connected between the output terminal and ground, comprises a plurality of NMOS transistors constituting constant-current sources and electronic switches connected in series. Selected constant-currents from PMOS transistors are switched to the first load resistor through the common output terminal depending on one group of input digital codes. Selected constant-currents of NMOS transistors are switched to the second load resistor through the common output terminal depending on the other group of input digital codes.

12 Claims, 7 Drawing Sheets

CURRENT MODE DIGITAL-TO-ANALOG CONVERTER USING COMPLEMENTARY DEVICES

BACKGROUND OF THE INVENTION

1. Field of the Invention

This invention relates to a current mode digital-to-analog (D/A) converter, and more particularly, to a current mode D/A converter having configurations that exhibit a wide range of analog output voltages with good linearity.

2. Description of the Related Art

A current mode D/A converter is one in which several constant-current sources or constant-current stages are connected in parallel to an output terminal or node through respective switches and the output terminal in turn is connected to a load resistor. The switches, which are really electronic ones, are turned on and off by the control of input digital codes so that constant-currents from current sources flowing to the load through the output terminal are selectively controlled to obtain an analog output (refer to, for example, Japanese Laid-Open Patent Publication No. 289319/1989). In such D/A converters, the analog output voltage is the drop across the load resistor For example, fifteen identical current sources, each of which generates constant-current I, are prepared in the D/A converter if an input digital code is 4 bits long. Then a definite number of constant-current sources are actually connected to the output terminal, the number of which corresponds to the unique value of a input digital code ranging from 0000 to 1111 in natural binary representation. If a input digital code is 1010 for example, ten current sources are actually connected to the output node. Therefore, the total current flowing through a load resistor R1 is 10I and the voltage drop across it is 10IR1.

The remarkable feature of this current mode type of D/A converter is that it performs fast digital to analog conversion. The principal shortcoming is that each output voltage level as a fraction of the full-scale value is limited. More specifically, as disclosed in the above mentioned Japanese Laid-Open Patent Publication, a load resistor and a constant-current source and a switch in each leg of the D/A converter are serially connected between a positive supply line and ground line, and the analog output voltage is obtained as drop across the load resistor. Voltage drops also appear across constant-current sources and switches, and limit the analog output voltages to a narrow range. For example, if voltage drops across a constant-current source and a switch are respectively 2 volts and 1 volt and voltage between a positive supply line and a ground line is 5 volts, then the analog output dynamic range is limited at most within 2 volts. Accordingly, the requirements for using a supply voltage effectively and obtaining a wide analog output range cannot be met in a current mode D/A converter.

In the D/A converter disclosed in the above mentioned Japanese Laid-Open Patent Publication, at least one MOS transistor is used as a constant-current source. If an operating point on Id-Vd coordinates of the MOS transistor is shifted to the linear region from the saturation region where it was operated in order to reduce voltage drop across it, then the linearity of analog output voltages would be degraded. And such A/D converter would be impractical for use.

SUMMARY OF THE INVENTION

Accordingly, it is a main object of the present invention to provide a current mode D/A converter that performs fast digital-to-analog conversion and allows improved output dynamic range without a degradation of linearity.

The object of the invention can be achieved by a D/A converter comprising: a first output load selectively connected between an output terminal and a first supply voltage; a first output means selectively connected between the output terminal and a second supply voltage, said first output means comprising a plurality of constant-current sources connected in parallel with the second supply voltage, each of which includes a MIS device of one conduction type, and a plurality of electronic switches, each of which is connected in series to the corresponding one of the constant-current sources; a second output load selectively connected between the output terminal and the second supply voltage; a second output means selectively connected between the output terminal and the first supply voltage, said second output means comprising a plurality of constant-current sources connected in parallel with the first supply voltage, each of which includes a MIS device of the other conduction type, and a plurality of electronic switches, each of which is connected in series to the corresponding one of the constant-current sources; and a switching control means for selectively switching constant-currents flowing from the first output means to the first output load through the output terminal depending on one group of input digital codes, and selectively switching constant-currents flowing from the second output means to the second output load through the output terminal depending on the other group of input digital codes.

Further objects and advantages of the present invention will be apparent from the following description of the preferred embodiment of the invention as illustrated in the accompanying drawings.

DESCRIPTION OF THE PREFERRED EMBODIMENT

Figure 1:
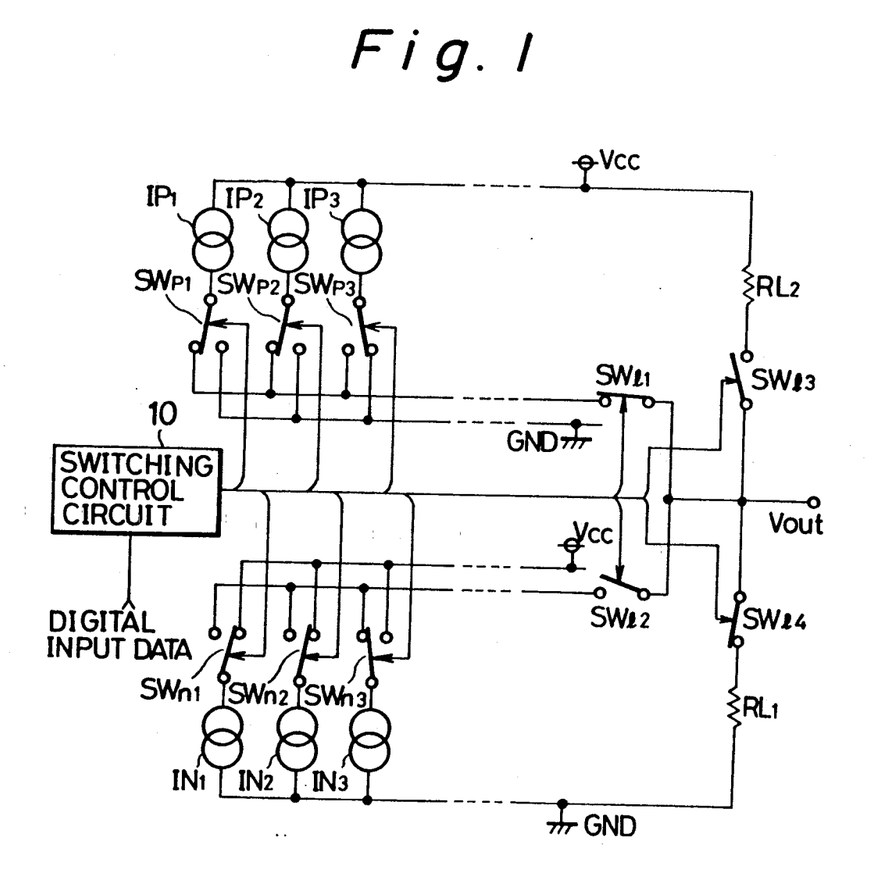
FIG. 1 is a circuit diagram of a D/A converter in accordance with one embodiment of the invention, wherein a switching control circuit is shown in block form.

Referring now to FIG. 1 of the drawing showing one embodiment of the invention, a plurality of constant-current sources IP1, IP2, IP3, . . . are connected in parallel with a positive supply voltage Vcc. Each of the constant-current sources comprises a p-channel MOS (PMOS) transistor with its gate terminal connected to a predetermined d. c. bias as explained later. The other end of each of the constant-current sources IP1, IP2, IP3, . . . is connected to the corresponding one of the single-pole double-throw switches SWp1, SWp2, SWp3, . . . . The switches SWp1, SWp2, SWp3, . . . are connected to a single-pole single-throw switch SWl1 or ground GND. The switch SWl1 in turn is connected to an output terminal or node where an output voltage Vout is obtained. The output terminal is connected to ground GND through a single-pole single-throw switch SWl4 and a first load resistor RL1 connected in series.

A plurality of constant-current sources IN1, IN2, IN3, . . . are connected in parallel with ground GND. Each of the constant-current sources comprises a n-channel MOS (NMOS) transistor with its gate terminal connected to a predetermined d. c. bias as explained later. The other end of each of the constant-current sources IN1, IN2, IN3, . . . is connected to the corresponding one of the single-pole double-throw switches SWn1, SWn2, SWn3, . . . . The switches SWn1, SWn2, SWn3, . . . are connected to a single-pole single-throw switch SWl2 or the positive supply voltage Vcc. The switch SWl2 in turn is connected to the output terminal. The output terminal is connected to the positive supply voltage Vcc through a single-pole single-throw switch SWl3 and a second load resistor RL2 connected in series.

Constant-current sources IP1, IP2, IP3, . . . and switches SWp1, SWp2, SWp3, . . . constitute a first output circuit. Constant-current sources IN1, IN2, IN3, . . . and switches SWn1, SWn2, SWn3, . . . constitute a second output circuit. Therefore, the first output circuit is selectively connected between the positive supply voltage Vcc and the output terminal through the switch SWl1. And the second output circuit is selectively connected between ground GND and the output terminal through the switch SWl2

Digital input codes are applied to a switching control circuit 10, which selectively connects the first output circuit through the output terminal to ground GND by turning switches SWl1, SWl4 on and switches SWl2, SWl3 off, or the second output circuit through the output terminal to the positive supply voltage Vcc by turning switches SWl2, SWl3 on and switches SWl1, SWl4 off. The switching control circuit 10 further control the switches SWp1, SWp2, SWp3, . . . , and switches SWn1, SWn2, SWn3, . . . to selectively switch the constant-currents flowing from constant-current sources to load resistors RL1 or RL2 through the output terminal.

Explanation will be made of the case where, for example, a 4-bit digital code is inputted to the D/A converter. Eight constant-current sources IP1, IP2, IP3, . . . , each comprising a PMOS transistor, and seven constant-current sources IN1, IN2, IN3, . . . , each comprising a NMOS transistor, are respectively employed in the first and second output circuits. If an input digital code lies in the range of 0000 to 1000, the switches SWl1, SWl4 are controlled to be turned on, and the switches SWl2, SWl3 are controlled to be turned off in order to activate the first output circuit. A definite number of switches SWp1, SWp2, SWp3, . . . are further controlled so as to switch constant currents flowing from the corresponding constant-current sources IP1, IP2, IP3, . . . to the output terminal, the number of which depends on the value of a input digital code. As the result, the output voltage corresponding to the input digital data is produced at the output terminal.

If an input digital code lies in the range of 1001 to 1111, the switches SWl2 and SWl3 are controlled to be turned on, and the switches SWl1 and SWl4 are controlled to be turned off, in order to activate the second output circuit. If the input digital code is 1001, the switches SWn1, SWn2, SWn3, . . . are further controlled so as to switch constant-currents flowing from all 7 constant-current sources IN1, IN2, IN3, . . . to the output terminal. When the input digital code is 1111, the switches SWn1, SWn2, SWn3, . . . are further controlled so as to switch a constant-current flowing from only one of the constant-current sources IN1, IN2, IN3, . . . to the output terminal.

It is required that linearity is ensured in a smooth manner when the first output circuit is changed over to the second output circuit, and vice versa. Therefore, the analog output voltage corresponding to the input digital code 1000 must be Vcc/2. And also the analog output voltage corresponding to the input digital code 1001 must be Vcc/2+Vcc/16.

The general expressions for determining the output voltage Vout at the output terminal can be written as follows:

$$Vout = N \cdot Ip \cdot Rl1$$

when a input digital code lies in the range of 0000 to 1000, and $$Vout = Vcc - (16 - N) \cdot In \cdot Rl2$$

when a input digital code lies in the range of 1001 to 1111, where
N = the value of an input digital code,
Ip = the current value of the identical constant-current sources IP1, IP2, IP3,
In = the current value of the identical constant-current sources IN1, IN2, IN3, . . . .

Therefore the output voltages corresponding to input codes 1000 and 1001 must be:

$$8Ip \cdot Rl1 = Vcc/2$$

and $$8In \cdot Rl2 = Vcc/2$$

in order to ensure linearily notwithstanding the switching of the first and second output circuit. This requirement can easily be achieved by adjusting the bias conditions for constant-current sources IP1, IP2, IP3, ... and IN1, IN2cc, IN3, ... and/or the values of the load resistors RL1, RL2.

Figure 2:
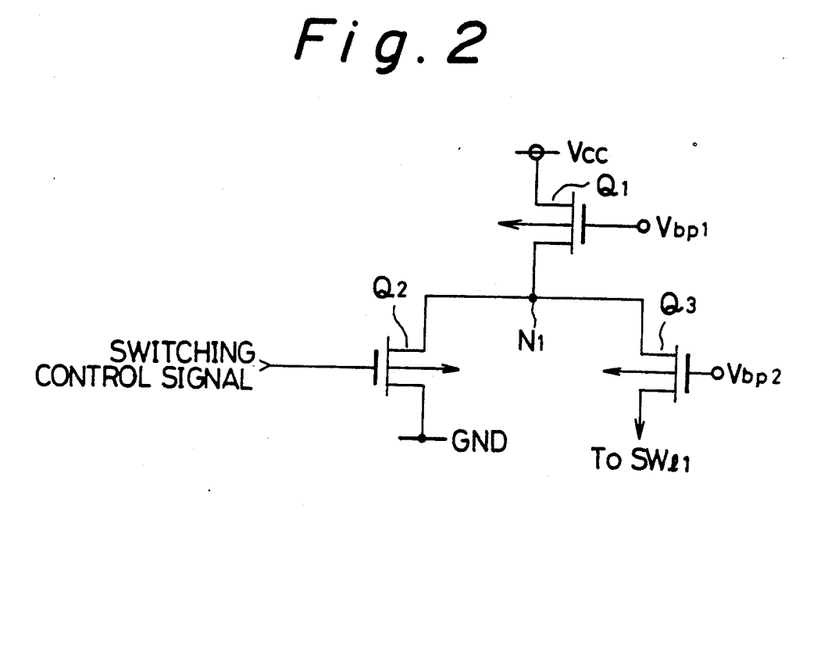
FIG. 2 is a circuit diagram of a constant-current source and an electronic switch using p-channel MOS transistors in a leg of a first output circuit.

FIG. 2 shows a PMOS transistor circuit for a constant-current source and an electronic switch in a leg of the first output circuit using constant-current sources IP1, IP2, IP3, .... The source terminal of PMOS transistor Q1 constituting a constant-current source is connected to the positive supply voltage Vcc, and the drain terminal of PMOS transistor Q1 is connected to the node N1. The node N1 in turn is connected to the source terminals of PMOS transistors Q2 and Q3 constituting an electronic switch. The drain terminal of PMOS transistor Q2 is connected to ground GND, and the drain terminal of PMOS transistor Q3 is connected to the switch SW11. A bias voltage Vbp1 is applied to the gate terminal of PMOS transistor Q1 and a bias voltage Vbp2 is applied to the gate terminal of PMOS transistor Q3. A control signal from the switching control circuit 10 is applied to the gate terminal of PMOS transistor Q2.

If the switching control signal is at high level, the PMOS transistor Q2 is turned off, and the voltage of node N1 becomes approximately equal to the positive supply voltage Vcc. Therefore, the PMOS transistor Q3 is turned on, and the constant-current flows through the switch SW11 to a load resistor RL1 shown in FIG. 1. On the other hand, if the switching control signal is at low level, the PMOS transistor Q2 is turned on, and the voltage of node N1 become approximately equal to the ground potential. Therefore, the PMOS transistor Q3 is turned off, and the constant-current is short-circuited to ground GND through the PMOS transistor Q2.

Figure 3:
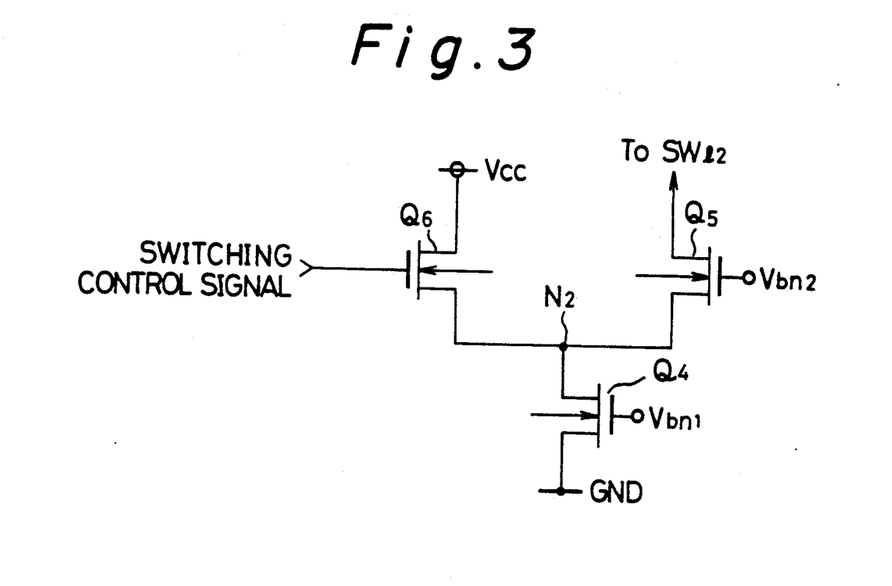
FIG. 3 is a circuit diagram of a constant current source and an electronic switch using n-channel MOS transistors in a leg of a second output circuit.

FIG. 3 shows a NMOS transistor circuit for a constant-current source and an electronic switch in a leg of the second output circuit using constant-current sources IN1, IN2, IN3, .... The source terminal of NMOS transistor Q4 constituting a constant-current source is connected to ground GND, and the drain terminal of NMOS transistor Q4 is connected to the node N2. The node N2 in turn is connected to the source terminals of NMOS transistors Q5 and Q6 constituting an electronic switch. The drain terminal of NMOS transistor Q6 is connected to the positive supply voltage Vcc, and the drain terminal of NMOS transistor Q5 is connected to the switch SW12. A bias voltage Vbn1 is applied to the gate terminal of NMOS transistor Q4 and a bias voltage Vbn2 is applied to the gate terminal of NMOS transistor Q5. A control signal from the switching control circuit 10 is applied to the gate terminal of NMOS transistor Q6.

If the switching control signal is at low level, the NMOS transistor Q6 is turned off, and the voltage of node N2 becomes approximately equal to the ground potential. Therefore, the NMOS transistor Q5 is turned on, and the constant-current flows through the switch SW12 from a load resistor RL2 shown in FIG. 1. On the other hand, if the switching control signal is at high level, the NMOS transistor Q6 is turned on, and the voltage of node N2 becomes approximately equal to the positive supply voltage Vcc. Therefore, the NMOS transistor Q5 is turned off, and the constant-current flows from the positive supply voltage Vcc to node N2 directly through the NMOS transistor Q6.

Figure 4:
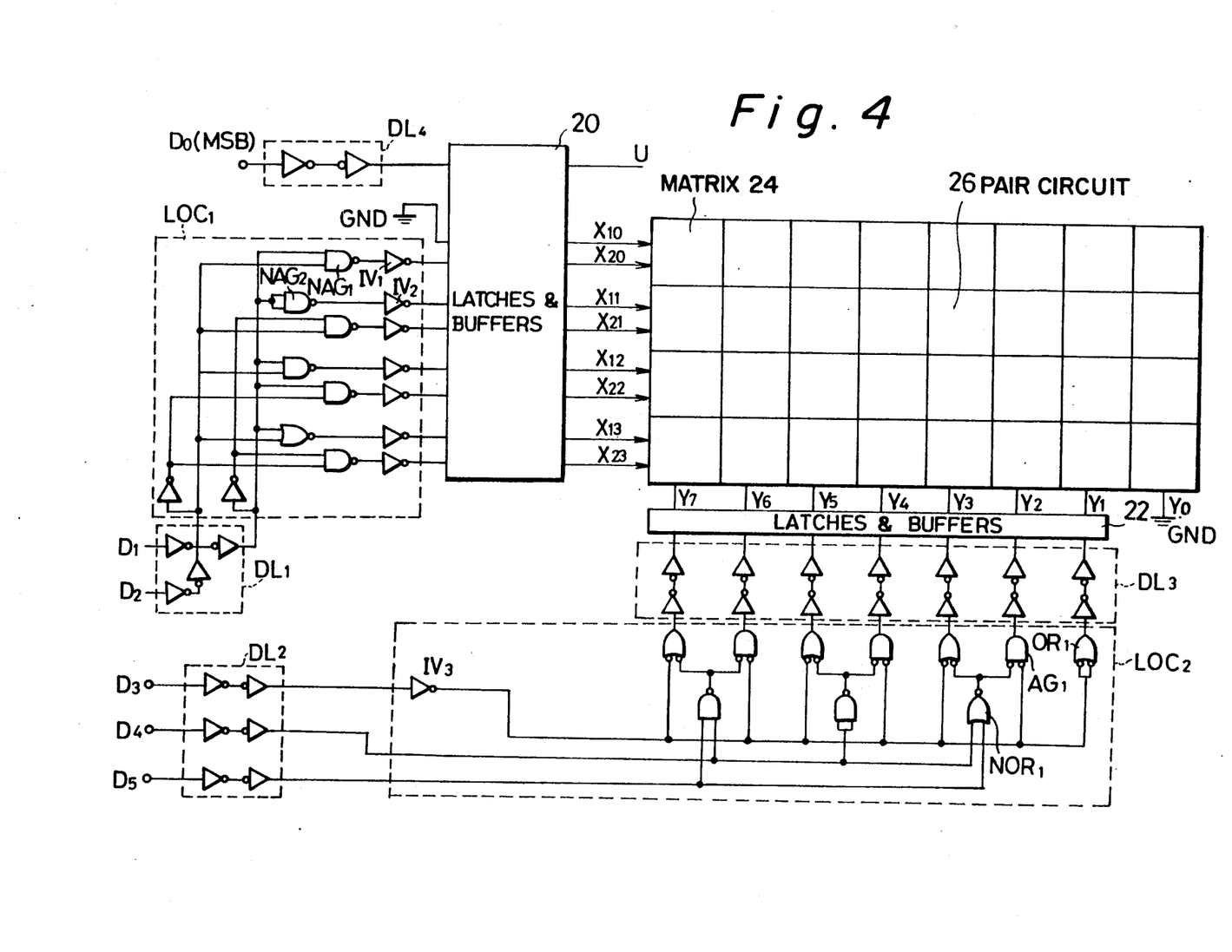
FIG. 4 is a circuit diagram of a 6-bit D/A converter in accordance with a second embodiment of the invention, wherein a switching control circuit is shown in detail.

Referring to FIG. 4 showing a second embodiment of the invention, which is a variation of the embodiment illustrated in FIG. 1, an input digital code is assumed to be six bits long. D0, D1, D2, D3, D4, and D5 denote the bit string of the input digital code from the MSB to the LSB in order. In this example, the input MSB (D0) directly controls the switches SW11, SW12, SW13 and SW14, illustrated in FIG. 1, as explained later in detail. Thirty two pair circuits, each comprising complementary current sources and switches taken one by one from the first and second output circuits illustrated in FIG. 1, are arranged in rows and columns of a matrix 24.

The input MSB (D0) produces a control signal on a line U after passing through a delay circuit DL4 comprising series connected inverters and Latches & Buffers 20.

The input two MSBs (D1, D2) are applied through a delay circuit DL1 comprising series connected inverters to a logic circuit LOC1 comprising nine inverters, six NAND gates and one NOR gate. The output of the logic circuit LOC1 produces on lines X20, X11, X21, X12, X22, X13 and X23 control signals to select pair circuits after passing through Latches & Buffers 20. Lines X10, X11, X12 and X13 are respectively connected to the pair circuits located in the first, second, third and fourth rows from the top. Lines X20, X21, X22 and X23 are respectively connected to the pair circuits located in the first, second, third and fourth row from the top.

A line X10 is grounded. For example, the bit D1 is applied to one input of NAND gate NAG1 after passing through the delay circuit DL1. The bit D2 is applied to the other input of NAND gate NAG1 after passing through the delay circuit DL1. The output of NAND gate NAG1 produces a control signal on line X20 after passing through a inverter IV1 and Latches & Buffers 20. Also, the bit D1 is applied to the two inputs of NAND gate NAG2 simultaneously after passing through a delay circuit DL1. The output of NAG2 produces a control signal on a line X11 after passing through inverter IV2 and Latches & Buffers 20. Therefore, the logical equations for control signals on line X10, X20, X11, X21, X12, X22, X13 and X23 are as follows:

$X10 = 0$ $X20 = D1 \cdot D2$ $X11 = D1$ $X21 = D1' \cdot D2$ $X12 = D1 \cdot D2$ $X22 = D1 \cdot D2'$ $X13 = D1 + D2$ $X23 = D1' \cdot D2'$.

where the symbols $+$, $\cdot$, and $'$ denote logical addition, multiplication and complementation.

The three LSBs (D3, D4, D5) are applied through a delay circuit DL2 comprising series connected inverters to a logic circuit LOC2 comprising one inverter, four OR gates having two inverting inputs, two NAND gates, three AND gates having two inverting inputs and one NOR gate. The output of the logic circuit LOC2 produces control signals on lines Y1, Y2, Y3, Y4, Y5, Y6 and Y7 to select pair circuits after passing through a delay circuit DL3 comprising series connected inverters and Latches & Buffers 22. Lines Y0, Y1, Y2, Y3, Y4, Y5, Y6 and Y7 are respectively connected to the pair circuits located in the first, second, third, fourth, fifth, sixth, seventh and eighth column from the right.

The line Y0 is grounded. For example, the bit D3 is applied to two inverting inputs of OR gate OR1 simultaneously after passing through the delay circuit DL2 and inverter IV3. The output of OR gate OR1 produces a control signal on line Y1 after passing through the delay circuit DL3 and Latches & Buffers 22. Also, the bit D3 is applied to one inverting input of AND gate AG1 after passing through the delay circuit DL2 and inverter IV3. The bit D4 is applied to one input of NOR gate NOR1 after passing through the delay circuit DL2. The bit D5 is applied to another input of NOR gate NOR1 after passing through the delay circuit DL2. The output of the NOR gate NOR1 is applied to the other inverting input of AND gate AG1. The output of the AND gate AG1 produces a control signal on the line Y2 after passing through the delay circuit DL3 and Latches & Buffers 22. Therefore, logical equations for control signals on lines Y0, Y1, Y2, Y3, Y4, Y5, Y6 and Y7 are as follows:

$$Y0 = 0$$

$$Y1 = D3$$

$$Y2 = D3 \cdot (D4 + D5)$$

$$Y3 = D3 + D4 + D5$$

$$Y4 = D3 \cdot D4$$

$$Y5 = D3 + D4$$

$$Y6 = D3 \cdot D4 \cdot D5$$

$$Y7 = D3 + D4 \cdot D5.$$

Thus, if the control signals on lines X10, X11, X12 and X13 are at high level, then all the control signals on the lines S in the pair circuits located in the corresponding rows become high level. If the control signals on lines X20, X21, X22 and X23 are at high level, then the control signals on the lines S in the pair circuits located in the corresponding rows partly become high level where the control signals on lines Y1, Y2, Y3, Y4, Y5, Y6 and Y7 are at high level.

Figure 5:
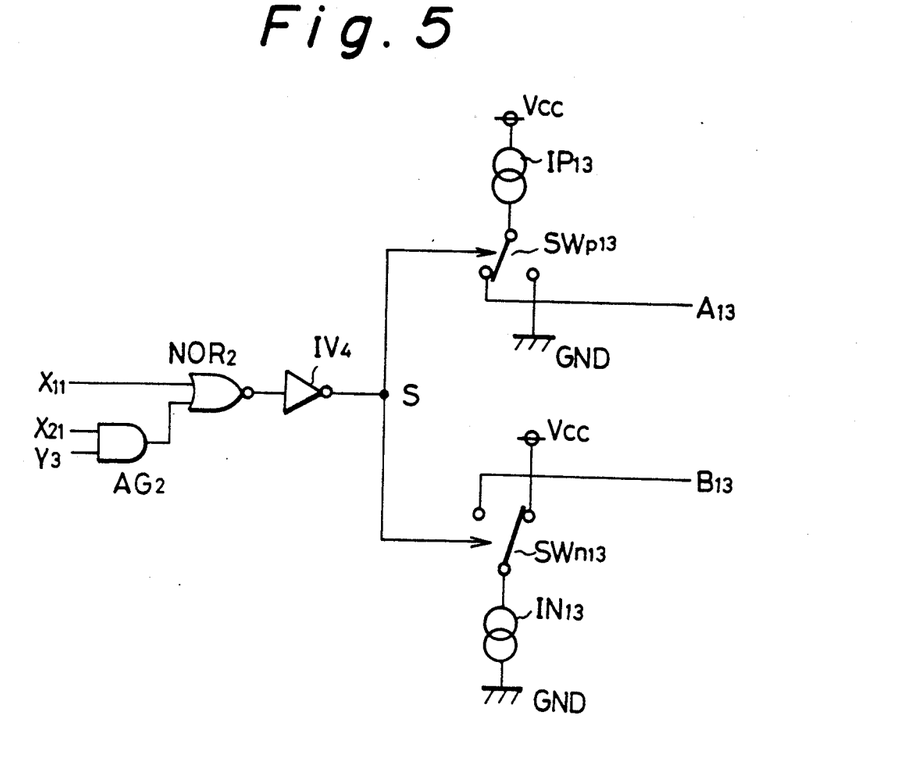
FIG. 5 is a circuit diagram of a pair circuit of complementary current sources and switches, taken one by one from the first and second output circuits, together with associated gate elements used in the second embodiment of the invention shown in FIG. 4.

A pair circuit 26 located in the second row and the fourth column of the matrix 24 is shown in FIG. 5 in detail.

Referring to FIG. 5, one end of a constant current source IP13 comprising a PMOS transistor is connected to the positive supply voltage Vcc. The other end of the constant-current source IP13 is connected to ground GND or a line A13 through a single-pole double-throw switch SWp13. One end of a constant-current source IN13 comprising a NMOS transistor is connected to ground GND. The other end of the constant-current source IN13 is connected to the positive supply voltage Vcc or a line B13 through a single-pole double-throw switch SWn13. The control signal X11 is applied to one input of NOR gate NOR2. The control signal X21 is applied to one input of an AND gate AG2 and the control signal Y3 is applied to the other input of the AND gate AG2. The output signal of the AND gate AG2 is applied to the other input of NOR gate NOR2. The output signal of NOR gate NOR2 produces a control signal on a line S to control switches SWp13, SWn13 after passing through a inverter IV4. The logical equation for the control signal on the line S is as follows:

$$S = X11 + Y3 \cdot X21.$$

Figure 6:
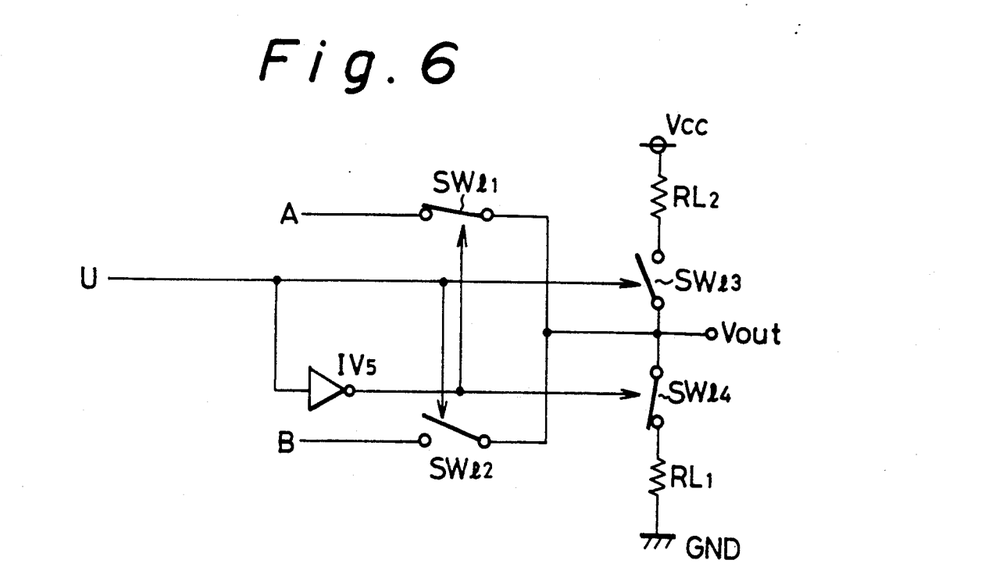
FIG. 6 is a circuit diagram of switches, each of which is connected to an output terminal, used in the second embodiment of the invention shown in FIG. 4.

Referring to FIG. 6 showing a circuit diagram of switches, the control signal on the line U, illustrated also in FIG. 4, controls directly the positions of switches SW12, SW13 and also controls the position of the switches SW11, SW14 after passing through a inverter IV5. If the control signal U is 0, switches SW11, SW14 are turned on and switches SW12, SW13 are turned off. A line A is connected to ground GND through the first load RL1. If the control signal U is 1, switches SW11, SW14 are turned off and switches SW12, SW13 are turned on. Then, a line B is connected to the positive supply voltage Vcc through the second load RL2.

Figure 7A:
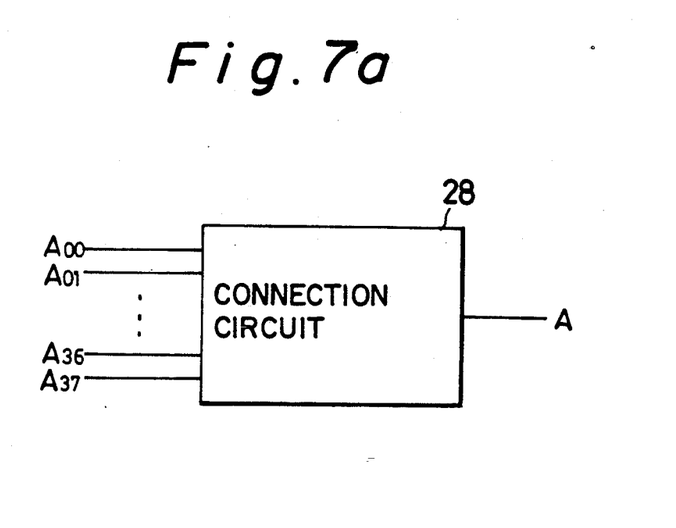
FIGS. 7a and 7b are connection diagrams of lines for summing analog currents used in the second embodiment of the invention shown in FIG. 4.
Figure 7B:
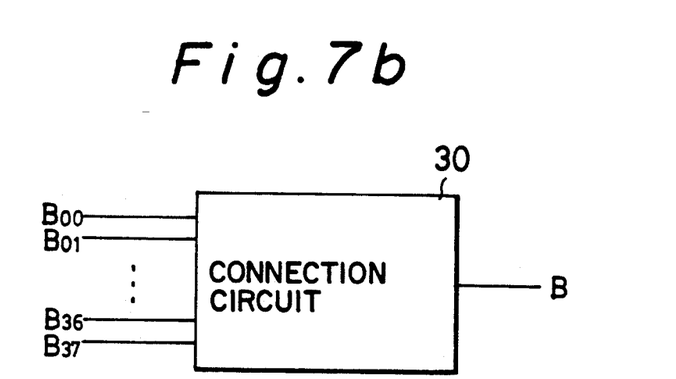

Referring to FIG. 7a showing a connection diagram, lines A00, A01 ... A36 and A37 of pair circuits located in the matrix 24 are connected together to the line A, also illustrated in FIG. 6, in a connection circuit 28. In FIG. 7b, lines B00, B01 ... B36 and B37 of pair circuits located in the matrix 24 are connected together to the line B, also illustrated in FIG. 6, in a connection circuit 30 shown in block form.

Figure 8:
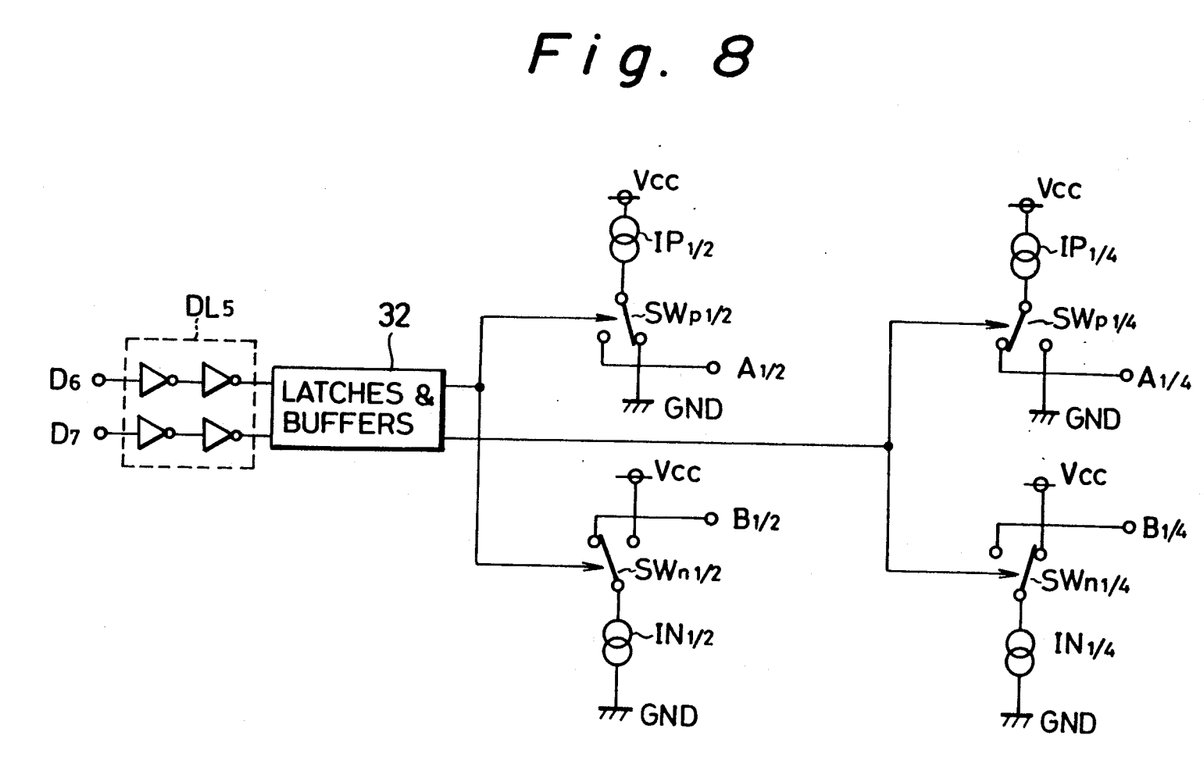
FIGS. 8 is a circuit diagram of two pair circuits of complementary current sources and switches, which are added to extend the length of input digital code to be converted from 6 bits to 8 bits, used in a third embodiment of the invention.

Referring to FIG. 8, showing a circuit diagram of two pair circuits of complementary current sources and switches used in a third embodiment of the invention, the pair circuits are similar to the one illustrated in FIG. 5, except that values of the currents generated by the constant-current sources are binary weighted. The values of constant-currents generated by constant-current sources IP1/2, IN1/2 and IP1/4, IN1/4 are respectively one-half and one-fourth of the one generated by constant-current sources IP13 and IN13 in FIG. 5.

One end of the constant-current source IP1/2 is connected to the positive supply voltage Vcc and the other end of the current source IP1/2 is connected to ground GND or a line A1/2 through a single-pole double-throw switch SWp1/2. One end of the constant-current source IN1/2 is connected to ground GND and the other end of current source IN1/2 is connected to the positive supply voltage Vcc or a line B1/2 through a single-pole double-throw switch SWn1/2. One end of the constant-current sources IP1/4 is connected to the supply Vcc and the other end of the constant-current source IP1/4 is connected to ground or a line A1/4 through a single-pole double-throw switch SWp1/4. One end of the constant-current source IN1/4 is connected to ground GND and the other end of the constant-current source IN1/4 is connected to the positive supply voltage Vcc or a line B1/4 through a single-pole double-throw switch SWn1/4.

The bit D6 controls directly the switches SWp1/2, SWn1/2 after passing through a delay circuit DL5 and Latches & Buffers 32. And the bit D7 controls directly the switches SWp1/4 and SWn1/4 after passing through the delay circuit DL5 and Latches & Buffers 32.

Figure 9A:
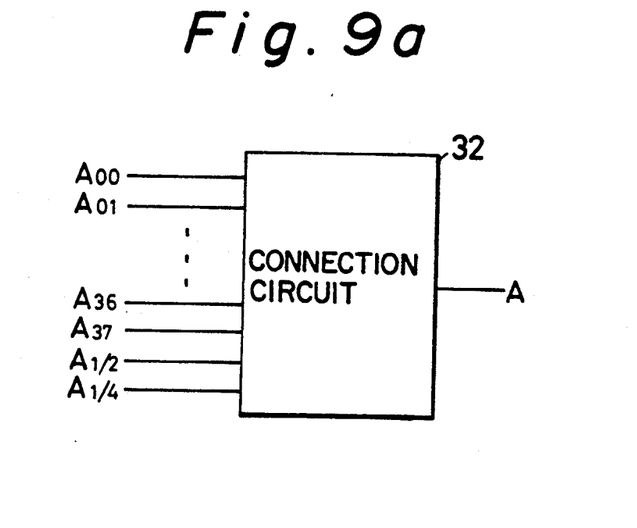
FIGS. 9a and 9b are connection diagrams of lines for summing analog currents used in the third embodiment of the invention partly shown in FIG. 8.
Figure 9B:
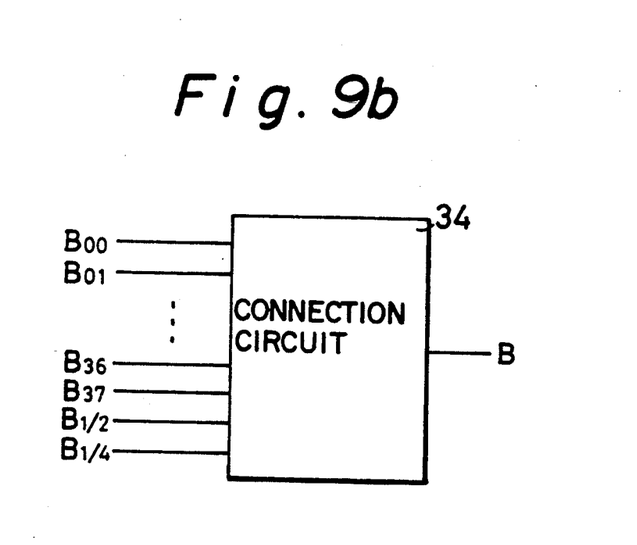

Referring to FIG. 9a showing a connection diagram, lines A00, A01 ... A36 and A37 of the pair circuits located in the matrix 24 together with lines A1/2 and A1/4 are connected together to the line A, also illustrated in FIG. 6, in a connection circuit 32. In FIG. 9b, lines B00, B01 ... B36 and B37 of the pair circuits located in the matrix 24 together with lines B1/2 and B1/4 are connected together to the line B, also illustrated in FIG. 6, in a connection circuit 34 shown in block form. Therefore, an analog output voltage Vout corresponding to the input eight-bit codes may be obtained at the output terminal illustrated in FIG. 6 by means of circuits 32, 34 summing analog currents.

Many widely different embodiments of the present invention may be constructed without departing from the spirit and scope of the present invention. It should be understood that the present invention is not limited to the specific embodiments described in the specification, except as defined in the appended claims.

What is claimed is:

1. A digital-to-analog converter comprising:
   a first output load connected between an output terminal and a first supply voltage through a first switch;
   a first output means connected between the output terminal and a second supply voltage through a second switch, said first output means comprising a plurality of constant-current sources connected in parallel with the second supply voltage, each of which includes a MIS device of one conduction type, and a plurality of electronic switches, each of which is connected in series to the corresponding one of the constant-current sources;
   a second output load connected between the output terminal and the second supply voltage through a third switch;
   a second output means connected between the output terminal and the first supply voltage through a fourth switch, said second output means comprising a plurality of constant-current sources connected in parallel with the first supply voltage, each of which includes a MIS device of the other conduction type, and a plurality of electronic switches, each of which is connected in series to the corresponding one of the constant-current sources; and
   a switching control means for turning the first and the second switches on and turning the third and the fourth switches off depending on one group of input digital codes.

2. A digital-to-analog converter as in claim 1, wherein said MIS device is a MOS transistor.

3. A digital-to-analog converter as in claim 2, wherein said electronic switch comprises at least one MOS transistor.

4. A digital-to-analog converter as in claim 3, wherein said first and second output loads are resistors.

5. A digital-to-analog converter as in claim 4, wherein said first supply voltage is lower than said second supply voltage, and the MOS transistors employed as constant-current sources in the first and second output means are respectively PMOS and NMOS transistors.

6. A digital-to-analog converter as in claim 5, wherein said first supply voltage is ground and said second supply voltage is a positive voltage.

7. A digital-to-analog converter as in claim 4, wherein said first supply voltage is higher than said second supply voltage, and the MOS transistors employed as constant-current sources in the first and second output means are respectively NMOS and PMOS transistors.

8. A digital-to-analog converter as in claim 7, wherein said first supply voltage is ground and said second supply voltage is a negative voltage.

9. A digital-to-analog converter comprising:
   a first output load connected between an output terminal and a first supply voltage through a first switch;
   a first output means connected between the output terminal and a second supply voltage through a second switch, said first output means comprising a plurality of constant-current sources connected in parallel with the second supply voltage, each of which includes a MOS transistor of one conduction type, and a plurality of electronic switches, each of which is connected in series to the corresponding one of the constant-current sources;
   a second output load connected between the output terminal and the second supply voltage through a third switch;
   a second output means connected between the output terminal and the first supply voltage through a fourth switch, said second output means comprising a plurality of constant-current sources connected in parallel with the first supply voltage, each of which includes a MOS transistor of the other conduction type, and a plurality of electronic switches, each of which is connected in series to the corresponding one of the constant-current sources;
   a switching control means for turning the first and the second switches on and turning the third and the fourth switches off depending on one group of input digital codes, and turning the third and the fourth swiches on and turning the first and the second switches off depending on the other group of input digital codes; and
   said plurality of constant-current sources in the first and the second output means generating identical constant currents.

10. A digital-to analog converter comprising:
    a first output load connected between an output terminal and a first supply voltage through a first switch;
    a first output means connected between the output terminal and a second supply voltage through a second switch, said first output means comprising a plurality of constant-current sources connected in parallel with the second supply voltage, each of which includes a MOS transistor of one conduction type, and a plurality of electronic switches, each of which is connected in series to the corresponding one of the constant-current sources;
    a second output load connected between the output terminal and the second supply voltage through a third switch;
    a second output means connected between the output terminal and the first supply voltage through a fourth switch, said second output means comprising a plurality of constant-current sources connected in parallel with the first supply voltage, each of which includes a MOS transistor of the other conduction type, and a plurality of electronic switches, each of which is connected in series to the corresponding one of the constant-current sources;
    a switching control means for turning the first and the second switches on and turning the third and the fourth switches off depending on one group of input digital codes, and turning the third and the fourth swiches on and turning the first and the second switches off depending on the other group of input digital codes; and said plurality of constant-current sources in the first and the second output means generating binary weighted constant currents.

11. A digital-to-analog converter comprising:

a first output load connected between an output terminal and a first supply voltage through a first switch;

a first output means connected between the output terminal and a second supply voltage through a second switch, said first output means comprising a plurality of constant-current sources connected in parallel with the second supply voltage, each of which includes a MOS transistor of one conduction type, and a plurality of electronic switches, each of which is connected in series to the corresponding one of the constant-current sources;

a second output load connected between the output terminal and the second supply voltage through a third switch;

a second output means connected between the output terminal and the first supply voltage through a fourth switch, said second output means comprising a plurality of constant-current sources connected in parallel with the first supply voltage, each of which includes a MOS transistor of the other conduction type, and a plurality of electronic switches, each of which is connected in series to the corresponding one of the constant current sources;

a switching control means for turning the first and the second switches on and turning the third and the fourth switches off depending on one group of input digital codes, and turning the third and the fourth swiches on and turning the first and the second switches off depending on the other group of input digital codes; and some of said plurality of constant-current sources in the first and the second output means generating identical constant-current, and others generating binary weighted constant-currents.

12. A digital-to-analog converter comprising:

a first output load connected between an output terminal and a first supply voltage through a first switch;

a first output means connected between the output terminal and a second supply voltage though a second switch, said first output means comprising a plurality of constant-current sources connected in parallel with the second supply voltage, each of which includes a MOS transistor of one conduction type, and a plurality of electronic switches, each of which is connected in series to the corresponding one of the constant-current sources;

a second output load connected between the output terminal and the second supply voltage through a third switch;

a second output means connected between the output terminal and the first supply voltage through a fourth switch, said second output means comprising a plurality of constant-current sources connected in parallel with the first supply voltage, each of which includes a MOS transistor of the other conduction type, and a plurality of electronic switches, each of which is connected in series to the corresponding one of the constant-current sources;

a switching control means for turning the first and the second switches on and turning the third and the fourth switches off depending on one group of input digital codes, and turning the third and the fourth swiches on and turning the first and the second switches off depending on the other group of input digital codes; and said serially connected constant-current source and switch in each leg of the first and the second output circuits being paired one by one and arranged in rows and columns and controlled by the switching control means depending on input digital codes.

* * * * *